United States Patent
Koide (10) Patent No.: US 9,978,803 B2
(45) Date of Patent: May 22, 2018

(54) IMAGING APPARATUS AND ELECTRONIC APPARATUS

(71) Applicant: Seiko Epson Corporation, Tokyo (JP)

(72) Inventor: Yasunori Koide, Matsumoto (JP)

(73) Assignee: Seiko Epson Corporation (JP)

( * ) Notice: Subject to any disclaimer, the term of this patent is extended or adjusted under 35 U.S.C. 154(b) by 183 days.

(21) Appl. No.: 15/162,800

(22) Filed: May 24, 2016

(65) Prior Publication Data
US 2016/0358329 A1    Dec. 8, 2016

(30) Foreign Application Priority Data

Jun. 8, 2015 (JP) .................. 2015-115833

(51) Int. Cl.
| | |
|---|---|
| H01L 27/146 | (2006.01) |
| H04N 5/361 | (2011.01) |
| H04N 5/374 | (2011.01) |
| H04N 5/378 | (2011.01) |
| H04N 5/3745 | (2011.01) |

(52) U.S. Cl.
CPC .. H01L 27/14678 (2013.01); H01L 27/14623 (2013.01); H01L 27/14643 (2013.01); H04N 5/361 (2013.01); H04N 5/378 (2013.01); H04N 5/3745 (2013.01)

(58) Field of Classification Search
CPC ......... H01L 27/14678; H01L 27/14643; H01L 27/14623; H04N 5/361; H04N 5/378; H04N 5/3745
See application file for complete search history.

(56) References Cited

U.S. PATENT DOCUMENTS

| | | | | |
|---|---|---|---|---|
| 2010/0308345 | A1* | 12/2010 | Brown | G02F 1/13318 257/82 |
| 2012/0199927 | A1* | 8/2012 | Shimotsusa | H01L 27/14623 257/432 |
| 2014/0353471 | A1* | 12/2014 | Raynor | G01J 1/1626 250/214 C |

FOREIGN PATENT DOCUMENTS

| | | |
|---|---|---|
| JP | 2012-164686 A | 8/2012 |
| JP | 2012-199485 A | 10/2012 |

* cited by examiner

*Primary Examiner* — Gevell Selby
(74) *Attorney, Agent, or Firm* — Harness, Dickey & Pierce, P.L.C.

(57) ABSTRACT

An imaging apparatus includes a plurality of unit circuits connected to a detection line, and a signal output circuit. Each of the plurality of unit circuits includes a light receiving device including an electrode connected to a wire and an electrode, and a transistor that controls electrical connection between the electrode and the detection line. The signal output circuit includes a light receiving device in a light-blocking state including an electrode connected to a wire and an electrode, and a detection circuit that outputs a detection signal according to a potential of a detection point between the electrode and the electrode when the light receiving device and the light receiving device are in a reverse bias state between the wire and the wire.

14 Claims, 8 Drawing Sheets

IMAGING APPARATUS AND ELECTRONIC APPARATUS

BACKGROUND

1. Technical Field

The present invention relates to imaging using a plurality of light receiving devices.

2. Related Art

Patent Document 1 (JP-A-2012-199485) discloses a photoelectric conversion apparatus in which a plurality of unit devices are arranged in a matrix form. Each of the plurality of unit devices includes a light receiving device that generates electric charge according to an amount of received light and an amplification transistor that generates a detection signal according to a voltage on one end of the light receiving device.

In the technology of Patent Document 1, the amplification transistor is formed with respect to each unit device. Therefore, there is a problem that detection accuracy (light sensitivity) of the amount of received light of each light receiving device varies due to an error in property of a threshold voltage of the transistor of each unit device or the like.

SUMMARY

An advantage of some aspects of the invention is to uniformize detection accuracy of amounts of received light of a plurality of light receiving devices.

An imaging apparatus according to a preferred aspect of the invention includes a plurality of unit circuits connected to a detection line, and a signal output circuit, wherein each of the plurality of unit circuits includes a first light receiving device including a first electrode connected to a first wire and a second electrode, and a first transistor that controls electrical connection between the second electrode and the detection line, and the signal output circuit includes a second light receiving device in a light-blocking state including a third electrode connected to a second wire and a fourth electrode, and a detection circuit that outputs a detection signal according to a potential of a detection point between the second electrode and the fourth electrode when the first light receiving device and the second light receiving device are in a reverse bias state between the first wire and the second wire. In the above described configuration, the detection signal according to the potential of the detection point when the first light receiving device and the second light receiving device are in the reverse bias state between the first wire and the second wire (i.e., a potential formed by division of a voltage between the first wire and the second wire by the first light receiving device and the second light receiving device), and thereby, amounts of received light of the first light receiving devices of the respective unit circuits may be detected with high accuracy. Further, the second receiving device is used in common with respect to the plurality of unit circuits, and thereby, the detection accuracy of the amounts of received light of the first light receiving devices can be uniformized over the plurality of unit circuits compared to a configuration in which both the first light receiving device and the second light receiving device are provided with respect to each unit circuit.

In a preferred aspect of the invention, the detection circuit includes a second transistor having a gate connected to the detection point. For example, the second transistor is used for a pair of differential transistors forming the detection circuit. In the above described configuration, the second transistor for detecting the potential of the detection point is used in common with respect to the plurality of unit circuits, and thereby, the detection accuracy of the amounts of received light of the first light receiving devices can be uniformized over the plurality of unit circuits compared to a configuration in which the second transistor is provided with respect to each unit circuit.

In a first aspect of the invention, the plurality of unit circuits are arranged in a plurality of columns connected to the detection lines different from one another, and the signal output circuit includes the second light receiving device and the detection circuit with respect to each of the plurality of columns. Further, in a second aspect of the invention, the plurality of unit circuits are arranged in a plurality of columns connected to detection lines different from one another, and the signal output circuit includes an output line, third transistors provided to correspond to the respective plurality of columns and controlling electrical connection between the output line and the detection lines of the columns, a column selection circuit that sequentially controls the third transistors to be in an on-state, the second light receiving device having the fourth electrode connected to the output line, and the detection circuit that outputs a detection signal according to a potential of the detection point on the output line. In the first aspect, the second light receiving device and the detection circuit are provided with respect to each of the plurality of columns, and there is an advantage that the amounts of received light of the respective first light receiving devices may be rapidly detected compared to the second aspect. On the other hand, in the second aspect, the common circuit is used in common over the plurality of columns, and there is an advantage that the configuration of the signal output circuit is simplified compared to the first aspect.

In a third aspect of the invention, the plurality of unit circuits are arranged in a plurality of columns connected to detection lines different from one another, and the signal output circuit includes a predetermined number of output lines and common circuits, third transistors provided to correspond to the respective plurality of columns, and a column selection circuit that sequentially controls the third transistors to be in an on-state with respect to each group formed by sectioning the plurality of columns in units of the predetermined number, the predetermined number of detection lines of the respective groups are connected to the output lines different from one another via the third transistors, and each of the predetermined number of common circuits includes the second light receiving device having the fourth electrode connected to the output line corresponding to the common circuit, and the detection circuit that outputs a detection signal according to a potential of the detection point on the output line. In the above described aspect, both the advantage of the above described first aspect that the amounts of received light of the respective first light receiving devices may be rapidly detected and the advantage of the second aspect that the configuration of the signal output circuit is simplified can be compatibly realized.

In a preferred aspect of the invention, a first potential and a second potential are selectively supplied to the first wire, and the first transistor has a gate connected to the first wire and, when the first potential is supplied to the first wire, turns to an on-state in which the second electrode and the detection line are electrically connected. In the above described aspect, the first wire connected to the first electrode of the first light receiving device is also used for the control of the first transistor, and there is an advantage that the configuration of the imaging apparatus is simplified compared to a configuration in which another wire than the first wire controls the first transistor.

Note that, in this application, a state in which an element A and an element B are electrically connected refers to a state in which the element A and the element B may be set in an equal logic state (at a potential in a design concept). Specifically, the state in which the element A and the element B are electrically connected includes not only a state in which the element A and the element B are directly connected via a wire but also a state in which the element A and the element B are indirectly connected via an electric element such as a resistance element or switching element. That is, even when the potential of the element A and the potential of the element B are slightly different, if the elements are handled as an equal logic on the circuit, the element A and the element B may be interpreted to be in the electrical connection. Therefore, for example, in a state in which the first transistor is maintained in the on-state, the first light receiving device and the detection line are electrically connected to each other.

The imaging apparatuses according to the respective aspects of the invention are used for various electronic apparatuses. A typical example of the electronic apparatus is a video apparatus that captures images (still images and moving images) of objects. However, for example, the imaging apparatuses according to the above described respective aspects of the invention are also preferably used for biological information measuring apparatuses that measure biological information by imaging of vein images of living bodies.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
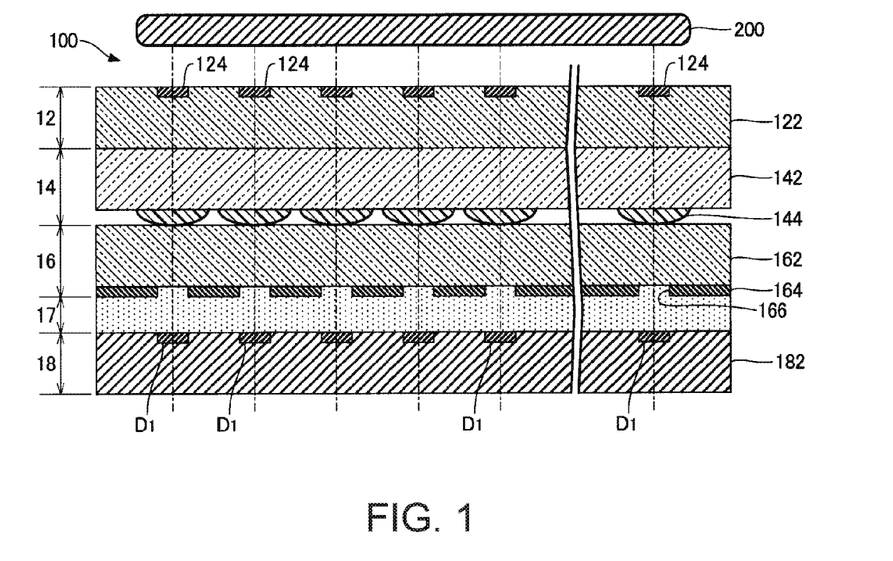
FIG. 1 is a sectional view of an imaging system of a first embodiment.

FIG. 1 is a configuration diagram of an imaging system 100 according to the first embodiment of the invention. The imaging system 100 of the first embodiment is an apparatus that images an object 200 and includes an illumination unit 12, a light-collecting unit 14, a light-blocking unit 16, and an imaging apparatus 18 as illustrated in FIG. 1. The illumination unit 12, the light-collecting unit 14, and the light-blocking unit 16 are provided between the imaging apparatus 18 and the object 200. The illumination unit 12 is located between the object 200 and the light-collecting unit 14 and the light-blocking unit 16 is located between the imaging apparatus 18 and the light-collecting unit 14. The light-blocking unit 16 and the imaging apparatus 18 are bonded to each other using a light-transmissive adhesive agent 17. The imaging system 100 of the first embodiment is used for a biological information measuring apparatus that measures biological information including e.g. oxygen saturation, a blood sugar level, or the like and images e.g. veins of a hand and fingers of a subject as the object 200.

As illustrated in FIG. 1, the illumination unit 12 includes a light-transmissive substrate 122 and a plurality of light emitting devices 124. The plurality of light emitting devices 124 are formed on a surface of the substrate 122 on the object 200 side, and outputs illumination light having a specific wavelength and illuminates the object 200. For example, the plurality of light emitting devices 124 radiate near-infrared light (having a wavelength from 700 nm to 900 nm) to be transmitted through a body tissue of the object 200 and absorbed by reduced hemoglobin of blood in veins to the object 200 as illumination light. Note that the object 200 can be illuminated from the opposite side to the imaging apparatus 18 with the object 200 in between.

The light-collecting unit 14 is an element that collects imaging light incoming from the object 200 illuminated by the illumination unit 12, and includes a light-transmissive substrate 142 and a plurality of lenses 144. The plurality of lenses 144 are convex lenses formed on a surface of the substrate 142 facing the imaging apparatus 18 and collecting imaging light from the object 200. The light-blocking unit includes a light-transmissive substrate 162 and a light-blocking layer 164. The light-blocking layer 164 is a light-blocking thin film formed on a surface of the substrate 162 facing the imaging apparatus 18, in which a plurality of opening portions 166 for the passage of output lights from the lenses 144 different from one another are formed.

The imaging apparatus 18 captures imaging light from the object 200 transmitted through the illumination unit 12, the light-collecting unit 14, and the light-blocking unit 16. The imaging apparatus 18 of the first embodiment is a solid-state image sensing device having a plurality of light receiving devices D1 corresponding to the lenses 144 different from one another arranged on a surface of a substrate 182. The substrate 182 is formed using e.g. a semiconductor material.

Figure 2:
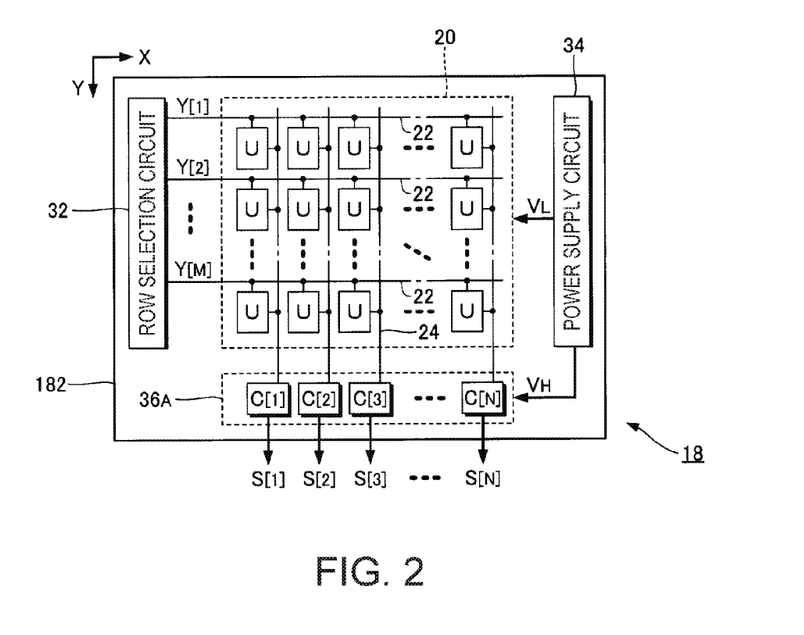
FIG. 2 is an electrical configuration diagram of an imaging apparatus of the first embodiment.

FIG. 2 is an electrical configuration diagram of the imaging apparatus 18. As illustrated in FIG. 2, the imaging apparatus 18 of the first embodiment includes an imaging unit 20, a row selection circuit 32, a power supply circuit 34, and a signal output circuit 36A. The power supply circuit 34 generates a potential VH and a potential VL. The potential VH exceeds the potential VL (VH>VL). For example, the potential VH is a power supply potential at the high level and the potential VL is a ground potential. The potential VH is supplied to e.g. the signal output circuit 36A and the potential VL is supplied to the imaging unit 20.

Figure 3:
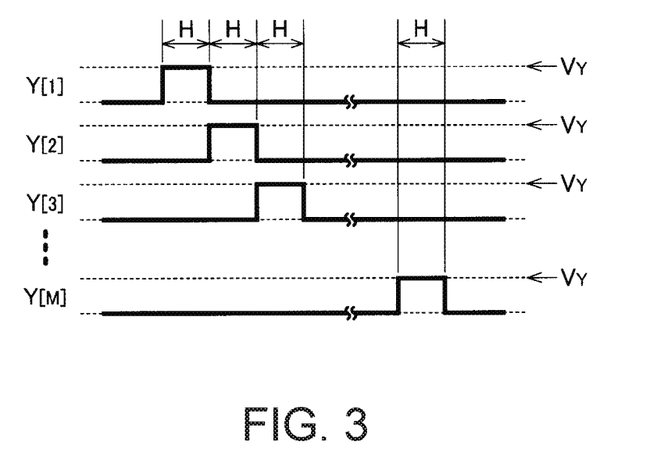
FIG. 3 is an explanatory diagram of an operation of a row selection circuit.

In the imaging unit 20, M selection lines 22 extending in the X direction and N detection lines 24 extending in the Y direction crossing the X direction are formed (M and N are natural numbers). Unit circuits U are provided in positions corresponding to intersections between the respective selection lines 22 and the respective detection lines 24. Namely, in the imaging unit 20, the plurality of unit circuits U are arranged in a matrix form with longitudinal M rows and lateral N columns. The row selection circuit 32 sequentially selects the selection lines 22 in each selection period H by supplying selection signals Y[m] (m=1 to M) to the respective M selection lines 22. Specifically, as illustrated in FIG. 3, the selection signal Y[m] supplied to the selection line 22 in the mth row is set to a selection voltage (high level) VY in the mth selection period H. The selection potential VY is a potential corresponding to selection of the selection line 22.

Figure 4:
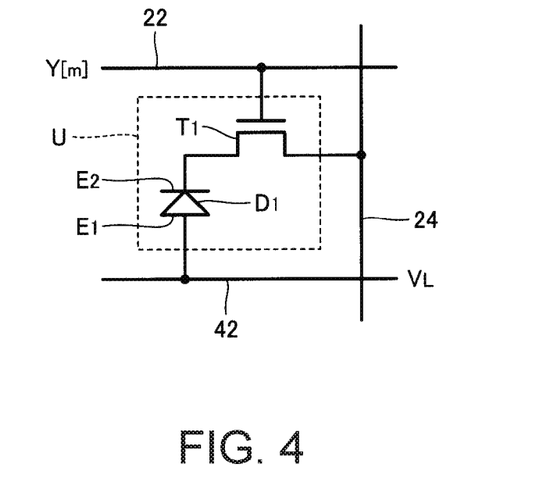
FIG. 4 is a configuration diagram of a unit circuit.

FIG. 4 is a configuration diagram of one arbitrary unit circuit U located in the nth column (n=1 to N) in the mth row of the imaging unit 20. As illustrated in FIG. 4, the unit circuit U of the first embodiment includes the light receiving device D1 and a transistor T1 (an exemplification of a first transistor). The light receiving device D1 is a photodiode that generates electric charge according to an amount of received light, and includes a stacking structure in which a photoelectric conversion layer is stacked between an electrode E1 (anode) and an electrode E2 (cathode). The light receiving device D1 of the first embodiment receives the imaging light from the object 200 by a chalcopyrite photoelectric conversion layer of $CuInSe_2$ (CIS), $Cu(In,Ga)Se_2$ (CIGS), or the like. The chalcopyrite photoelectric conversion layer has a tendency that the quantum efficiency is higher and high-sensitivity imaging may be easily realized, but the current leak (dark current) when no light is received larger. Note that the same tendency is observed in a configuration in which the photoelectric conversion layer of the light receiving device D1 is formed using polycrystalline or amorphous silicon.

As illustrated in FIG. 4, the electrode E1 of the light receiving device D1 is connected to a wire 42 to which the potential VL is supplied from the power supply circuit 34. The wire 42 is formed with respect to each row along the selection line 22. The transistor T1 is a switch that intervenes between the electrode E2 of the light receiving device D1 and the detection line 24 and controls electrical connection (conduction/insulation) between them. An N-channel transistor T1 is illustrated in FIG. 4, however, the conductivity type of the transistor T1 is arbitrary. As illustrated in FIG. 4, the gate of the transistor T1 is connected to the selection line 22 and the selection signal Y[m] supplied to the selection line 22 is set to the selection voltage VY in the selection period H, and thereby, the transistor T1 transitions to the on-state. When the transistor T1 transitions to the on-state, the electrode E2 of the light receiving device D1 is electrically connected to the detection line 24. As understood from the above explanation, in the first embodiment, the plurality of unit circuits U are arranged in a plurality of columns (N columns) corresponding to the detection lines 24 different from one another.

The signal output circuit 36A in FIG. 2 generates N series of detection signals S[1] to S[N] according to amounts of received light by the light receiving devices D1. The detection signals S[n] of one arbitrary series are voltage signals set to potentials according to the amounts of received light of the light receiving devices D1 in the M unit circuits U forming the nth column of the imaging unit 20. As illustrated in FIG. 2, the signal output circuit 36A of the first embodiment includes N common circuits C[1] to C[N] corresponding to the respective columns of the unit circuit U. The common circuit C[n] of the nth column generates a detection signal S[n]. That is, one common circuit C[n] is used in common for detection of the amounts of received light of the light receiving devices D1 in the M unit circuits U of the nth column.

Figure 5:
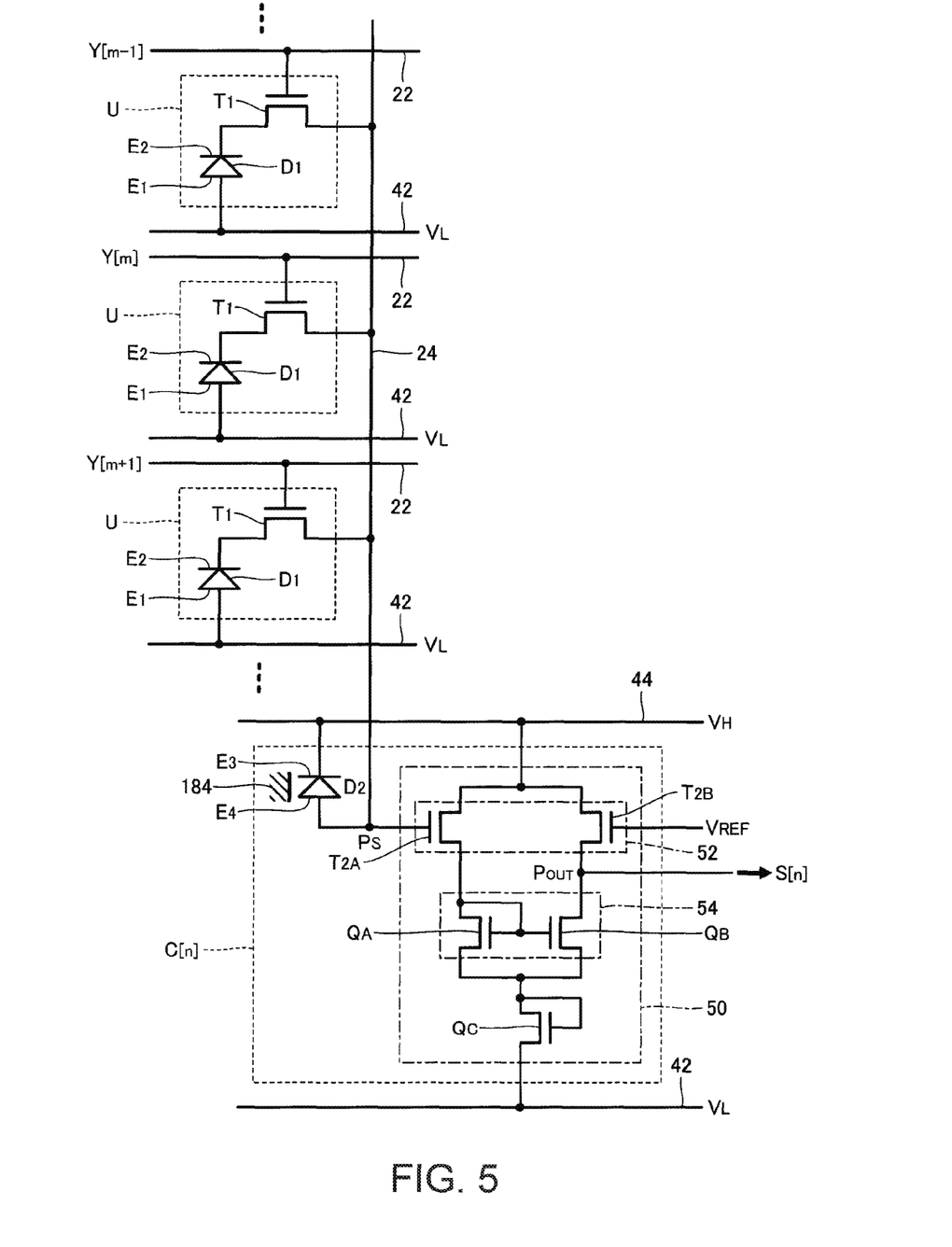
FIG. 5 is a configuration diagram of a common circuit.

FIG. 5 is a configuration diagram of the common circuit C[n] of the nth column. The respective unit circuits U ((m−1)th row to (m+1)th row) of the nth column are also shown for descriptive purposes in FIG. 5. As illustrated in FIG. 5, the common circuit C[n] includes a light receiving device D2 and a detection circuit 50. Namely, in the first embodiment, the receiving device D2 and the detection circuit 50 are provided for each of the N columns.

The light receiving device D2 is a photodiode that generates electric charge according to an amount of received light, and includes a stacking structure in which a photoelectric conversion layer is stacked between an electrode E3 (cathode) and an electrode E4 (anode) like the light receiving device D1. Note that, in contrast to the light receiving device D1 that can receive the imaging light from the object 200, the light receiving device D2 is in a light-blocking state in which the device can not receive incoming light from surrounding parts. Specifically, the light receiving device D2 is covered by a light-shielding or light-reflective light-blocking layer 184, and thereby, maintained in the light-blocking state. Further, the light receiving device D1 and the light receiving device D2 have structures (dimensions and shapes) and materials in common and are formed in the same process. Therefore, there is a tendency that the light receiving device D1 and the light receiving device D2 have electrical characteristics (e.g. voltage-current characteristics) approximately equal to each other.

Note that the configuration for setting the light receiving device D2 in the light-blocking state is not limited to the above described exemplification (light-blocking layer 184). For example, the light receiving device D2 can be shielded by the light-blocking layer 164 by a configuration in which the opening portion 166 is not formed in a part of the light-blocking layer 164 overlapping with the light receiving device D2 (i.e., a configuration in which the light receiving device D2 is covered by the light-blocking layer 164). As described above, according to the configuration in which the light receiving device D2 is shielded by the light-blocking layer 164, there is an advantage that the manufacturing process of the imaging apparatus 18 is simplified compared to a configuration in which the dedicated light-blocking layer 184 for shielding the light receiving device D2 is formed. As understood from the above explanation, the light-blocking state refers to a state in which the imaging light from the object 200 does not substantially reach the light receiving device D2, and the specific configuration for realizing the light-blocking state is arbitrary.

Figure 6:
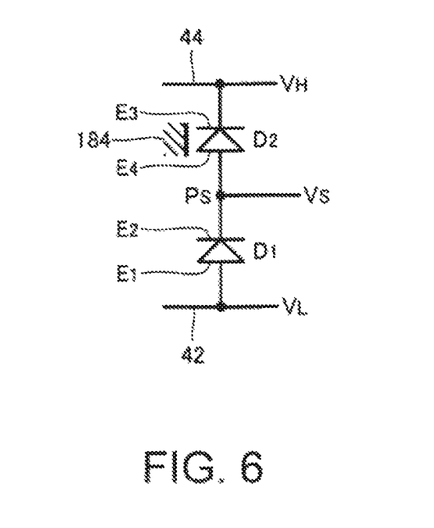
FIG. 6 is an explanatory diagram of a state of a light receiving device (reverse bias state).

As illustrated in FIG. 5, the electrode E3 of the light receiving device D2 is connected to a wire 44 (an exemplification of a second wire) to which the potential VH is supplied from the power supply circuit 34. The wire 44 runs over the N common circuits C[1] to C[N]. On the other hand, the electrode E4 of the light receiving device D2 is connected to a specific point (hereinafter, referred to as "detection point") PS of the detection line 24 of the nth column. As understood from FIG. 5, when the selection signal Y[m] is set to the selection potential VY in the mth selection period H and the transistor T1 of the unit circuit U in the nth column of the mth row transitions to the on-state, the electrode E2 of the light receiving device D1 of the unit circuit U and the electrode E4 of the light receiving device D2 of the common circuit C[n] of the nth column are series-connected via the detection line 24 (detection point PS). Namely, as illustrated in FIG. 6, the light receiving device D1 and the light receiving device D2 are connected in a reverse bias state between the wire 42 at the potential VL and the wire 44 at the potential VH.

As understood from FIG. 6, a potential VS at the detection point PS (hereinafter, referred to as "detection potential") is set to a potential formed by division of a differential voltage of the potential VL of the wire 42 and the potential VH of the wire 44 by a resistance of the light receiving device D1 and a resistance of the light receiving device D2. The resistance of the light receiving device D2 in the light-blocking state does not substantially vary, but the resistance of the light receiving device D1 varies according to the amount of received light of the light receiving device D1, and thereby, the detection potential VS at the detection point PS varies according to the amount of received light of the light receiving device D1. That is, in the mth selection period H, the detection potential VS according to the amount of received light of the light receiving device D1 of the unit circuit U located in the nth column of the mth row is generated at the detection point PS of the nth column. Specifically, as the amount of received light of the light receiving device D1 is larger (the resistance of the light receiving device D1 is lower), the detection potential VS is lower toward the potential VL side. The detection circuit 50 of the common circuit C[n] illustrated in FIG. 5 generates a detection signal S[n] according to the detection potential VS at the detection point PS in the nth column.

As illustrated in FIG. 5, the detection circuit 50 of the first embodiment includes a current mirror load differential amplifier circuit having a pair of differential transistors 52, a pair of load transistors 54, and a current source transistor QC. The pair of differential transistors 52 include a transistor T2A and a transistor T2B, and the pair of load transistors 54 include a transistor QA and a transistor QB. Note that the conductivity types of the respective transistors forming the detection circuit 50 may be appropriately changed from the exemplification (N-channel type) in FIG. 5.

The drains of the respective transistor T2A and transistor T2B of the pair of differential transistors 52 are connected to the wire 44 at the potential VH. The gate of the transistor T2A (an exemplification of a second transistor) is connected to the detection point PS, and a predetermined reference potential VREF is supplied to the gate of the transistor T2B. The reference potential VREF is set to e.g. an intermediate potential between the potential VH and the potential VL. The pair of load transistors 54 are a current mirror circuit that functions as a load circuit for the pair of differential transistors 52. The drain of the transistor QA is connected to the source of the transistor T2A, and the drain of the transistor QB is connected to the source of the transistor T2B. The gates of the respective transistor QA and transistor QB are connected in common to the drain of the transistor QA. The current source transistor QC is provided between the pair of load transistors 54 and the wire 42 and functions as a current source.

According to the configuration illustrated in FIG. 5, the detection signal S[n] according to the detection voltage VS supplied to the gate of the transistor T2A is output from an output point POUT between the transistor T2B and the transistor QB to an external apparatus. As understood from the above explanation, the detection signal S[n] is set to the potential according to the amount of received light of the light receiving device D1 of the unit circuit U in the nth column of the mth row in the mth selection period H. That is, the potential of the detection signal S[n] is set to the potential according to the amount of received light of each light receiving device D2 of the M unit circuits U in the nth column in time division in each selection period H.

Figure 7:
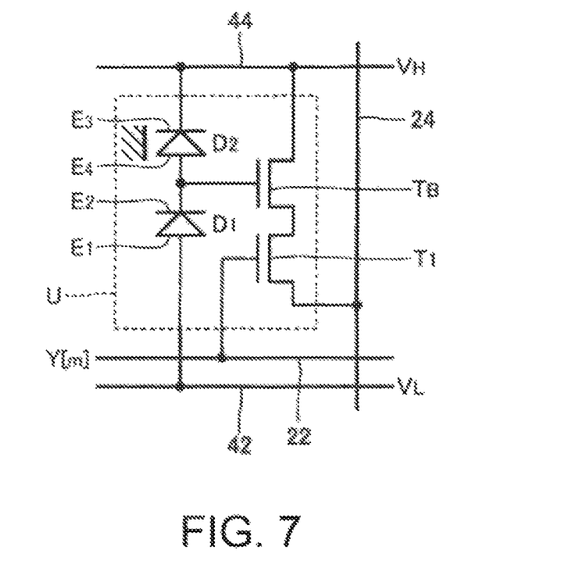
FIG. 7 is a configuration diagram of a unit circuit in a comparative example.

As a configuration of generating the detection signal according to the amount of received light of the light receiving device D1, for example, a configuration in which a plurality of unit circuits U shown in FIG. 7 are arranged in a matrix form (hereinafter, referred to as "comparative example") is also assumed. As understood from FIG. 7, in the comparative example, the light receiving device D2 in the light-blocking state and an amplification transistor TB are provided in each of the unit circuits U. That is, the light receiving device D1 and the light receiving device D2 are series-connected in the reverse bias state between the wire 42 and the wire 44, and a detection signal according to a potential of a connecting point between the light receiving device D1 and the light receiving device D2 is generated by the transistor TB and output to the detection line 24.

However, in the comparative example, there is a possibility that the light sensitivity of the light receiving device D1 (the relationship between the amount of received light and the potential of the detection signal) may be different with respect to each unit circuit U due to an error in electrical property (e.g. a threshold voltage) of the transistor TB of each unit circuit U. In contrast to the comparative example, in the first embodiment, one transistor T2A is used in common over the M unit circuits U for generation of the detection signals S[n] according to the amounts of received light of the light receiving devices D1, and, compared to the comparative example, there is an advantage that the influence of the errors in electrical property of the transistors is suppressed and the detection accuracy may be uniformized over the plurality of light receiving devices D1.

Further, in the configuration of the comparative example, the electrical property (e.g. resistance) of the light receiving device D2 in the light-blocking state may vary with respect to each unit circuit U due to errors, and there is a possibility that the light sensitivity of the light receiving device D1 may vary with respect to each unit circuit U. In contrast to the comparative example, in the first embodiment, one light receiving device D2 is used in common over the M unit circuits U for generation of the detection signals S[n] according to the amounts of received light of the light receiving devices D1, and, compared to the comparative example, there is an advantage that the influence of the errors in electrical property of the light receiving devices D2 is suppressed and the detection accuracy may be uniformized over the plurality of light receiving devices D1. Further, it is not necessary to provide the transistor T2A and the light receiving device D2 for each unit circuit U, and there are advantages that the configuration of the imaging unit 20 is simplified and high integration of many unit circuits U is easy.

Furthermore, in the first embodiment, the detection signal S[n] according to the detection voltage VS of the detection point PS between the light receiving device D1 and the light receiving device D2 in the reverse bias state (i.e., the potential formed by division of the differential voltage of the potential VH and the potential VL by the resistance of the light receiving device D1 and the resistance of the light receiving device D2) is generated. Accordingly, there is an advantage that, even when current leak (dark current) of the light receiving device D1 and the light receiving device D2 are large, the amount of received light of the light receiving device D1 may be detected with high accuracy. Therefore, the imaging apparatus 18 with higher sensitivity and higher accuracy using the photoelectric conversion layer with high quantum efficiency can be realized though current leak when no light is received larger.

Second Embodiment

Figure 8:
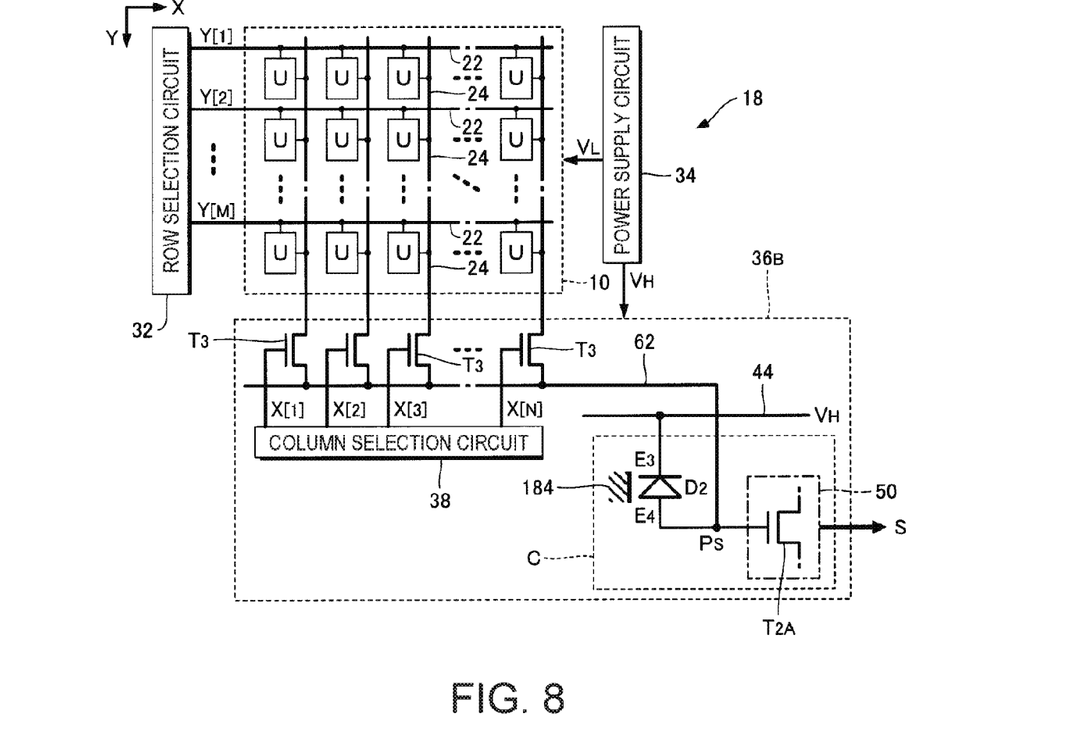
FIG. 8 is an electrical configuration diagram of an imaging apparatus of a second embodiment.

FIG. 8 is a configuration diagram of the imaging apparatus 18 in a second embodiment. As illustrated in FIG. 8, the imaging apparatus 18 of the second embodiment has a configuration in which the signal output circuit 36A in the first embodiment is replaced by a signal output circuit 36B. The signal output circuit 36B of the second embodiment includes a column selection circuit 38, an output line 62, a common circuit C, and N transistors T3 (an exemplification of a third transistor). In the signal output circuit 36A of the first embodiment, the common circuit C[n] is provided for each of the N columns, however, in the signal output circuit 36B of the second embodiment, one common circuit C is provided for the N columns. The common circuit C includes the light receiving device D2 and the detection circuit 50 like the common circuit C[n] of the first embodiment. The detection circuit 50 of the common circuit C has the same configuration as that of the first embodiment, however, outputs one series of detection signals S according to a detection potential VS of a detection point PS on the output line 62 to an external apparatus. Further, the electrode E4 of the light receiving device D2 is connected to the output line 62 (detection point PS).

As illustrated in FIG. 8, the transistors T3 are provided in correspondence with the respective N columns. The transistor T3 in an arbitrary nth column intervenes between the output line 62 and a detection line 24 of the nth column and controls electrical connection (conduction/insulation) between them. That is, the transistor T3 in the nth column transitions to the on-state, and thereby, the detection line 24 of the nth column is electrically connected to the output line 62. As illustrated in FIG. 8, the column selection circuit 38 sequentially controls the respective N transistors T3 to be in the on-state by supplying N series of control signals X[1] to X[N]. The control signal X[n] is supplied to the gate of the transistor T3 in the nth column.

Figure 9:
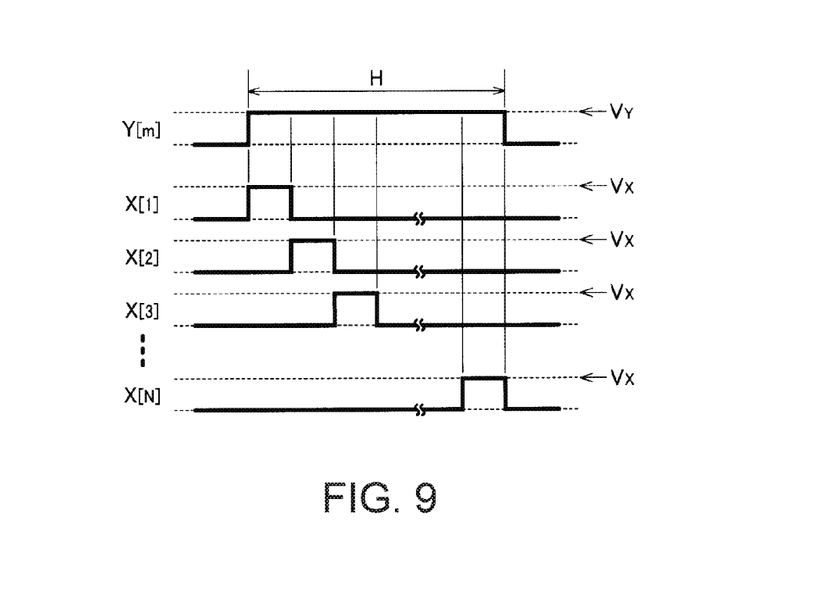
FIG. 9 is an explanatory diagram of an operation of a column selection circuit in the second embodiment.

FIG. 9 is an explanatory diagram of an operation of the column selection circuit 38. As illustrated in FIG. 9, the column selection circuit 38 alternatively sets the respective N series of control signals X[1] to X[N] to a selection potential VX in a predetermined order with respect to each selection period H in which the row selection circuit 32 selects a selection line 22 of the mth row. The selection potential VX is a potential that transitions the transistor T3 to the on-state (a potential corresponding to selection of the nth column). The control signal X[n] is set to the selection potential VX, and thereby, the detection line 24 of the nth column is connected to the output line 62. As understood from the above explanation, in the second embodiment, the operation of alternatively connecting the respective N detection lines 24 to the output line 62 is repeated in each selection period H. Therefore, in the selection period H in which the row selection circuit 32 selects the mth row, the detection voltage VS of the detection point PS of the output line 62 sequentially varies to the potential according to the amount of received light of each light receiving device D2 of the N unit circuits U in the mth row. That is, one series of detection signals S set to the potentials in time division according to the amounts of received light of the light receiving devices D2 of the respective unit circuits U in the longitudinal M rows and lateral N columns of the imaging unit 20 are generated in the detection circuit 50.

Also, in the second embodiment, the same advantages as those of the first embodiment are realized. Further, in the second embodiment, one common circuit C is used in common with respect to the plurality of columns (N columns), and there is an advantage that the configuration of the signal output circuit 36B is simplified compared to the first embodiment in which the common circuit C[n] is provided for each column. On the other hand, in the first embodiment, the detection signals S[n] are output in parallel over the N columns, and there is an advantage that the amounts of received light of the respective light receiving devices D2 of the imaging unit 20 may be rapidly detected compared to the second embodiment.

Third Embodiment

Figure 10:
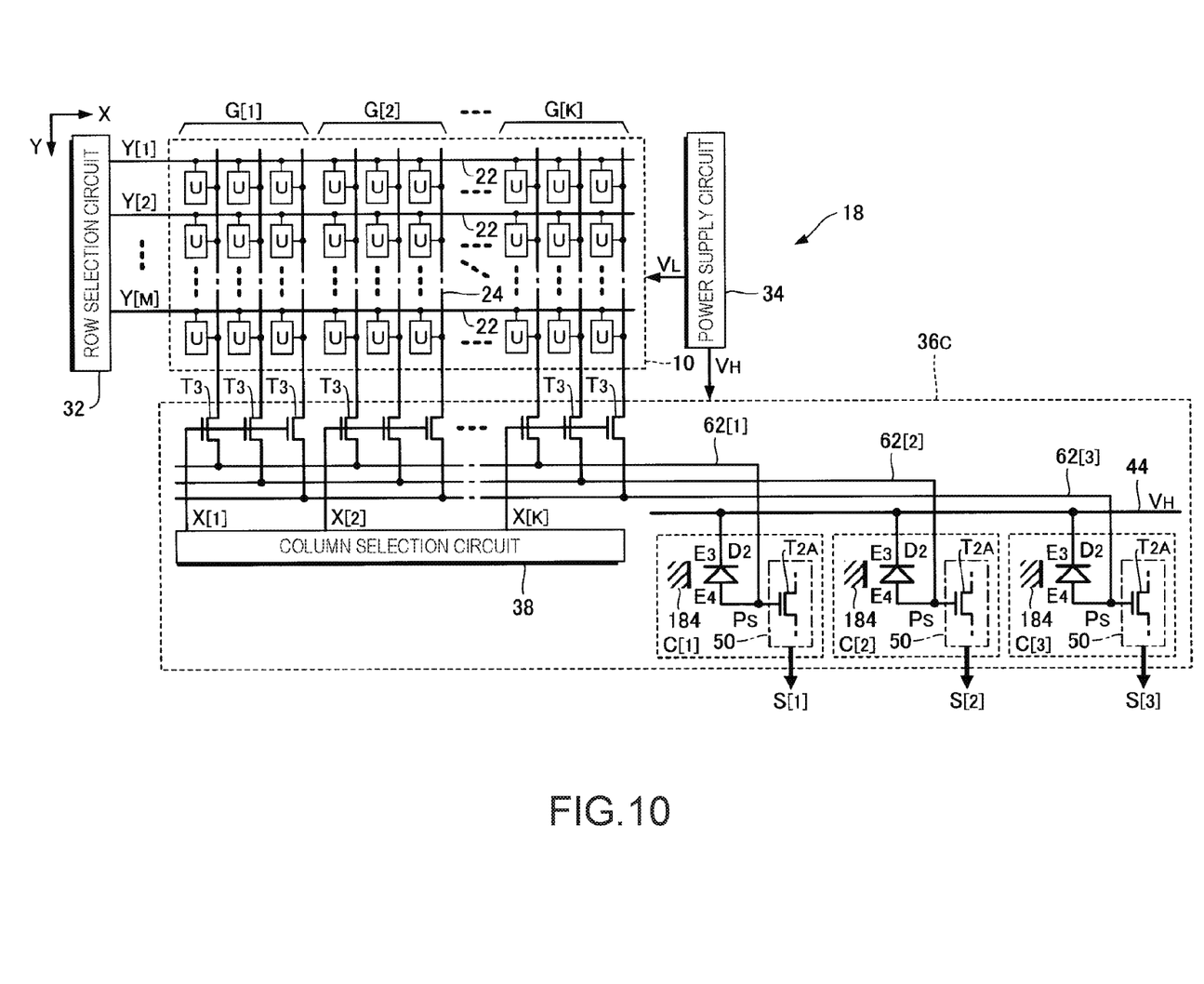
FIG. 10 is an electrical configuration diagram of an imaging apparatus of a third embodiment.

FIG. 10 is a configuration diagram of the imaging apparatus 18 in a third embodiment. As illustrated in FIG. 10, in the imaging apparatus 18 of the third embodiment, N columns of unit circuits U are sectioned in units of J columns (J is a natural number equal to or more than two) adjacent to each other in the X direction into K groups G[1] to G[K] (N=J×K). In the following explanation, the case where arbitrary one group G[k] (k=1 to K) includes three columns (J=3) will be exemplified for descriptive purposes, however, the number of columns J of one group G[k] is arbitrary.

The imaging apparatus 18 of the third embodiment has a configuration in which the signal output circuit 36A in the first embodiment is replaced by a signal output circuit 36C in FIG. 10. The signal output circuit 36C includes a column selection circuit 38, three (J) output lines 62[1] to 62[3], three (J) common circuits C[1] to C[3], and N transistors T3. One arbitrary output line 62[j] (j=1 to 3) corresponds to a detection line 24 in the jth column in each of the K groups G[1] to G[K]. Further, the common circuit C[j] includes the light receiving device D2 and the detection circuit 50 like the common circuit C[n] of the first embodiment. The detection circuit 50 of the common circuit C[j] has the same configuration as that of the first embodiment, however, outputs a detection signal S[j] according to a detection point PS on the output line 62[j] to an external apparatus. Further, the electrode E4 of the light receiving device D2 of the common circuit C[j] is connected to the detection point PS of the output line 62[j].

The transistors T3 are provided in correspondence with the respective N columns. The transistor T3 corresponding to the detection line 24 in the jth column in one arbitrary group G[k] intervenes between the output line 62[j] and the detection line 24 and controls electrical connection (conduction/insulation) between them. That is, the detection lines 24 in the jth columns in the respective K groups G[1] to G[K] (K lines in total) are connected in common to one arbitrary output line 62[j] via the respective transistors T3. In other words, the J detection lines 24 in the respective K groups G[1] to G[K] are connected to the output lines 62[j] different from one another via the transistors T3.

Figure 11:
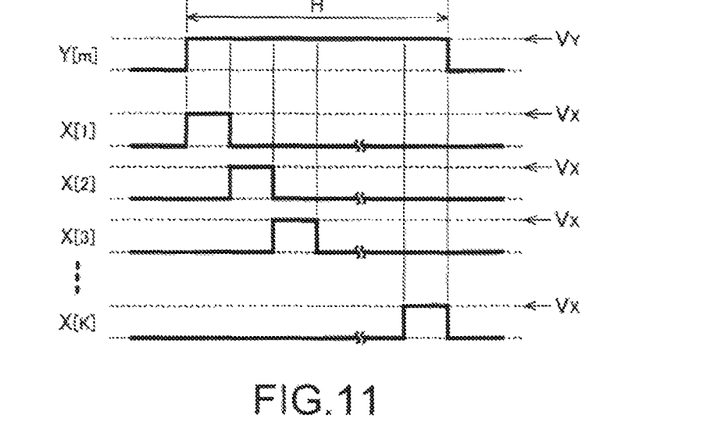
FIG. 11 is an explanatory diagram of an operation of a column selection circuit in the third embodiment.

The column selection circuit 38 in FIG. 10 sequentially controls the N transistors T3 to be the on-state with respect to each group G[k] (in threes) by supplying the K series of control signals X[1] to X[K] corresponding to the groups G[k] different from one another. FIG. 11 is an explanatory diagram of an operation of the column selection circuit 38. As illustrated in FIG. 11, the column selection circuit 38 alternatively sets the respective K series of control signals X[1] to X[K] to a selection potential VX in a predetermined order within the selection period H in which the row selection circuit 32 selects an arbitrary selection line 22 in the mth row. When the control signal X[k] is set to the selection potential VX, the three transistors T3 of the group G[k] corresponding to the control signal X[k] transit to the on state in parallel. Therefore, potentials according to the amounts of received light of the respective light receiving devices D2 of the three unit circuits U of the group G[k] in the mth row are supplied to the three output lines 62[1] to 62[3] in parallel. That is, potentials according to the amounts of received light of the respective light receiving devices D1 of the unit circuits U in the jth columns in the respective K groups G[1] to G[K] are sequentially supplied to the output lines 62[j] in time division as detection potentials VS. Therefore, the potentials of the detection signals S[j] are set to the potentials according to the amounts of received light of the respective light receiving devices D1 in the jth columns in the respective K groups G[1] to G[K] in time division.

Also, in the third embodiment, the same advantages as those of the first embodiment are realized. In the third embodiment, one common circuit C[j] is used in common with respect to the (K) unit circuits U in the jth columns in the respective K groups G[1] to G[K], and there is an advantage that the configuration of the signal output circuit 36C is simplified compared to the first embodiment in which the common circuit C[n] is provided for each column. Further, in the third embodiment, the detection signals S[1] to S[3] are output in parallel with respect to the three columns (J columns) of one arbitrary group G[k], and there is an advantage that the amounts of received light of the respective light receiving devices D2 of the imaging unit 20 may be rapidly detected compared to the second embodiment in which one common circuit C is used in common over the N columns. As understood from the above explanation, according to the third embodiment, both the advantage of rapid detection of amounts of received light of the first embodiment and the advantage of simplification of the signal output circuit 36C can be compatibly realized. The number of columns J of one group G[k] is appropriately selected so that both rapid detection of amounts of received light and simplification of configuration may be compatibly realized at a high level.

Fourth Embodiment

Figure 12:
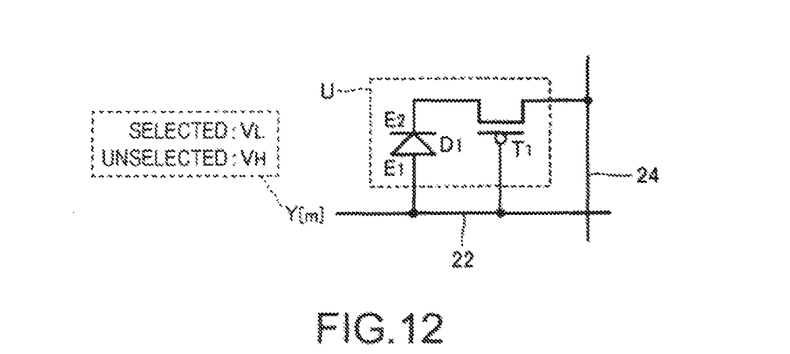
FIG. 12 is a configuration diagram of a unit circuit in a fourth embodiment.

FIG. 12 is a configuration diagram of a unit circuit U of the imaging apparatus 18 in a fourth embodiment. In the unit circuit U of the first embodiment (FIG. 4), the configuration in which the electrode E1 of the light receiving device D1 is connected to the wire 42 and the gate of the N-channel transistor T1 is connected to the selection line 22 is exemplified. In the fourth embodiment, as illustrated in FIG. 12, the electrode E1 of the light receiving device D1 of the unit circuit U and the gate of a P-channel transistor T1 are connected in common to the selection line 22 (an exemplification of a first wire).

The row selection circuit 32 of the fourth embodiment sets the selection signal Y[m] supplied to the selection line 22 in the mth row to the potential VH or the potential VL. Specifically, as illustrated in FIG. 12, the row selection circuit 32 sets the selection signal Y[m] to the potential VL in the mth selection period H in which the selection line 22 in the mth row is selected, and sets the selection signal Y[m] to the potential VH in the periods in which the mth row is not selected (in the other periods than the mth selection period H). In the selection period H in which the selection signal Y[m] is set to the potential VL, the potential VL is supplied to the electrode E1 of the light receiving device D1 and the transistor T1 is controlled to be in the on-state. Therefore, the light receiving device D1 and the light receiving device D2 are series-connected to each other in the reverse bias state like that of the exemplification in FIG. 6 between the selection line 22 in the mth row and the wire 44. The detection circuit 50 generates the detection signal S according to the detection potential VS at the detection point PS between the electrode E2 of the light receiving device D1 and the electrode E4 of the light receiving device D2 in the above described state.

Also, in the fourth embodiment, the same advantages as those of the first embodiment are realized. Further, in the fourth embodiment, the common selection line 22 is used for supply of the potential VL to the electrode E1 of the light receiving device D1 and the control of the transistor T1, and it is not necessary to form a separate wire 42 from the selection line 22 from the power supply circuit 34 to each unit circuit U. Therefore, there is an advantage that the configuration of the imaging unit 20 is simplified. Note that the unit circuit U of the fourth embodiment may be employed in the configurations of the second embodiment and the third embodiment.

Figure 13:
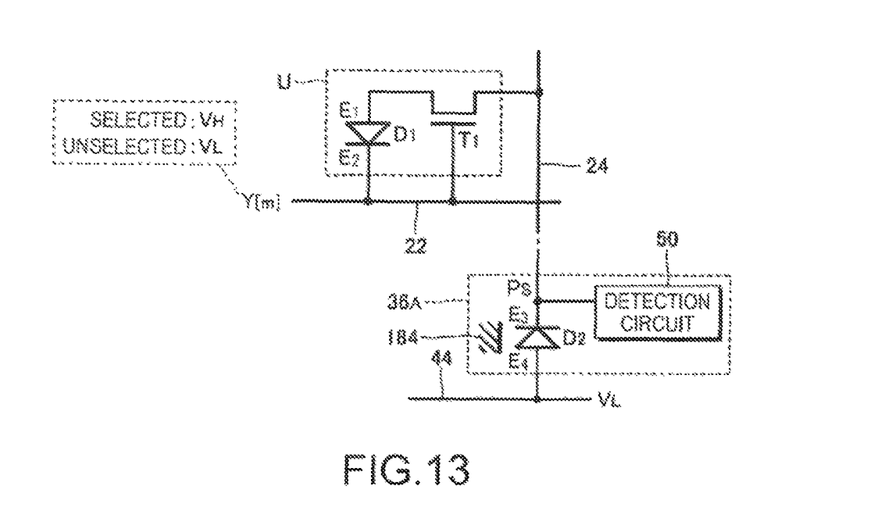
FIG. 13 is a configuration diagram of a unit circuit in another mode of the fourth embodiment.

In FIG. 12, the P-channel transistor T1 is provided in the unit circuit U, however, the configuration in which the the wire is used in common in the light receiving device D1 and the transistor T1 may be realized in a configuration in which an N-channel transistor T1 is used in FIG. 13. In the configuration in FIG. 13, the electrode E3 as the cathode of the light receiving device D1 and the gate of the transistor T1 are connected in common to the selection line 22, and the electrical connection between the electrode E1 as the anode of the light receiving device D1 and the detection line 24 is controlled by the transistor T1. On the other hand, the electrode E4 as the anode of the light receiving device D2 in the light-blocking state is connected to the wire 44 at the potential VL and the electrode E3 (cathode) is connected to the detection point PS. In the above described configuration, the row selection circuit 32 sets the selection signal Y[m] to the potential VH in the mth selection period H. Therefore, in the selection period H, the light receiving device D1 and the light receiving device D2 are series-connected to each other in the reverse bias state between the selection line 22 at the potential VH and the wire 44 at the potential VL, and the detection circuit 50 detects the detection potential VS at the detection point PS in the path between the electrode E1 of the light receiving device D1 and the electrode E3 of the light receiving device D2. Note that the configuration in FIG. 13 can be employed in the second embodiment and the third embodiment.

MODIFIED EXAMPLES

The above described embodiments may be variously modified. Specific embodiments of modifications will be exemplified as below. Two or more embodiments arbitrarily selected from the following exemplifications may be appropriately combined in a mutually consistent range.

Figure 14:
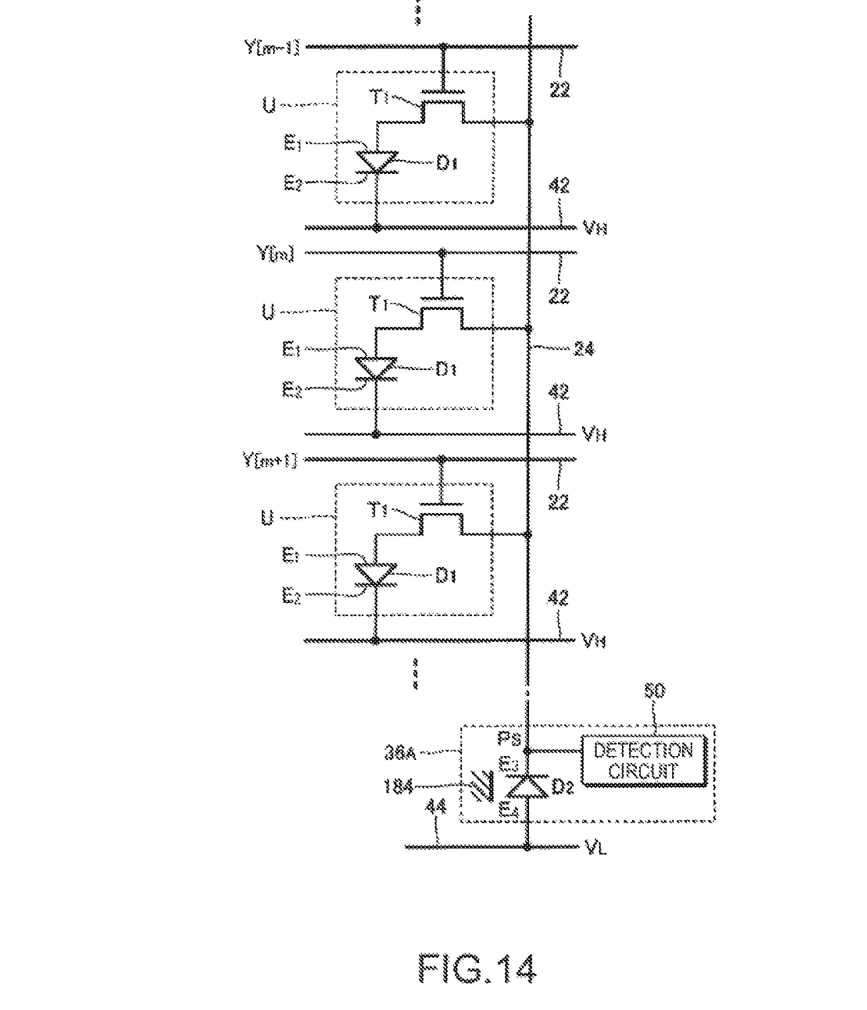
FIG. 14 is a configuration diagram of a modified example.

(1) In the first embodiment to the third embodiment, as illustrated in FIG. 6, the configuration in which the light receiving device D1 and the light receiving device D2 are series-connected in the reverse bias state between the wire 42 at the potential VL and the wire 44 at the potential VH is exemplified. However, as understood from the configuration in FIG. 13 exemplified in the fourth embodiment, in the first embodiment to the third embodiment, the light receiving device D1 and the light receiving device D2 can be series-connected in the reverse bias state between the wire 42 at the potential VH and the wire 44 at the potential VL. For example, on the basis of the configuration of the first embodiment, as illustrated in FIG. 14, the electrode E2 (cathode) of the light receiving device D1 can be connected to the wire 42 supplied with the potential VH and the electrode E4 (anode) of the light receiving device D2 can be connected to the wire 44 supplied with the potential VL. The detection circuit 50 generates the detection signal S according to the detection potential VS at the detection point PS between the electrode E1 (anode) of the light receiving device D1 and the electrode E3 (anode) of the light receiving device D2. Note that, in FIG. 14, the configuration of the first embodiment is used as the base, however, also, in the second embodiment and the third embodiment, the potential VH at the high level is supplied to the electrode E2 as the cathode of the light receiving device D1 and the potential VL at the low level is supplied to the electrode E4 as the anode of the light receiving device D2, and thereby, the light receiving device D1 and the light receiving device D2 can be brought into the reverse bias state.

(2) The row selection circuit 32 and the signal output circuit 36 (36A, 36B, 36C) are realized in forms of integrated circuits (IC chips) mounted on the substrate 182, or realized by transistors or the like directly formed on the substrate 182. Further, the configuration of the detection circuit 50 of the signal output circuit 36 is not limited to the differential amplifier circuit exemplified in the above described respective embodiments.

(3) The biological information that can be measured by the biological information measuring apparatus using the imaging system 100 of the above described respective embodiments is not limited to information (oxygen saturation, blood sugar levels) exemplified in the above described respective embodiments. For example, the imaging system 100 according to the above described respective embodiments can be used for measurements of biological information of alcohol concentration, cholesterol level, etc. in venous blood.

(4) The electronic apparatus to which the imaging apparatus 18 (imaging system 100) exemplified in the above described respective embodiments is applied is not limited to the biological information measuring apparatus exemplified in the above described respective embodiments. For example, the imaging apparatus 18 exemplified in the above described respective embodiments can be used for various electronic apparatuses including a digital camera and a digital camcorder (video camera) that capture images such as still images and moving images.

The entire disclosure of Japanese Patent Application No. 2015-115833 filed Jun. 8, 2015 is hereby incorporated herein by reference.

What is claimed is:
1. An imaging apparatus comprising:
a plurality of unit circuits connected to a detection line; and
a signal output circuit,
wherein each of the plurality of unit circuits includes
a first light receiving device including a first electrode connected to a first wire and a second electrode, and
a first transistor that controls electrical connection between the second electrode and the detection line, and
the signal output circuit includes
a second light receiving device in a light-blocking state including a third electrode connected to a second wire and a fourth electrode, and
a detection circuit that outputs a detection signal according to a potential of a detection point between the second electrode and the fourth electrode when the first light receiving device and the second light receiving device are in a reverse bias state between the first wire and the second wire.

2. The imaging apparatus according to claim 1, wherein the detection circuit includes a second transistor having a gate connected to the detection point.

3. The imaging apparatus according to claim 2, wherein the detection circuit is a differential amplifier circuit including a pair of differential transistors including the second transistor.

4. The imaging apparatus according to claim 1, wherein the plurality of unit circuits are arranged in a plurality of columns connected to detection lines different from one another, and
the signal output circuit includes the second light receiving device and the detection circuit with respect to each of the plurality of columns.

5. The imaging apparatus according to claim 1, wherein the plurality of unit circuits are arranged in a plurality of columns connected to detection lines different from one another, and
the signal output circuit includes
an output line,
third transistors provided to correspond to the respective plurality of columns and controlling electrical connection between the output line and the detection lines of the columns,
a column selection circuit that sequentially controls the third transistors to be in an on-state,
the second light receiving device having the fourth electrode connected to the output line, and
the detection circuit that outputs a detection signal according to a potential of the detection point on the output line.

6. The imaging apparatus according to claim 1, wherein the plurality of unit circuits are arranged in a plurality of columns connected to detection lines different from one another, and
the signal output circuit includes
a predetermined number of output lines and common circuits,
third transistors provided to correspond to the respective plurality of columns, and
a column selection circuit that sequentially controls the third transistors to be in an on-state with respect to each group formed by sectioning the plurality of columns in units of the predetermined number,
the predetermined number of detection lines of the respective groups are connected to the output lines different from one another via the third transistors, and
each of the predetermined number of common circuits includes the second light receiving device having the fourth electrode connected to the output line corresponding to the common circuit, and the detection circuit that outputs a detection signal according to a potential of the detection point on the output line.

7. The imaging apparatus according to claim 1, wherein a first potential and a second potential are selectively supplied to the first wire, and
the first transistor has a gate connected to the first wire and, when the first potential is supplied to the first wire, turns to an on-state in which the second electrode and the detection line are electrically connected.

8. An electronic apparatus comprising the imaging apparatus according to claim 1.

9. An electronic apparatus comprising the imaging apparatus according to claim 2.

10. An electronic apparatus comprising the imaging apparatus according to claim 3.

11. An electronic apparatus comprising the imaging apparatus according to claim 4.

12. An electronic apparatus comprising the imaging apparatus according to claim 5.

13. An electronic apparatus comprising the imaging apparatus according to claim 6.

14. An electronic apparatus comprising the imaging apparatus according to claim 7.

\* \* \* \* \*